United States Patent
McKenna-Olson et al.

[11] Patent Number: 5,879,172
[45] Date of Patent: Mar. 9, 1999

[54] SURFACE MOUNTED ADAPTER USING ELASTOMERIC CONDUCTORS

[75] Inventors: Paula E. McKenna-Olson, San Jose; Scott G. Barcellos; Daniel W. Altman, both of Sunnyvale, all of Calif.

[73] Assignee: Emulation Technology, Inc., Santa Clara, Calif.

[21] Appl. No.: 832,083

[22] Filed: Apr. 3, 1997

[51] Int. Cl.⁶ .................................................... H01R 4/58
[52] U.S. Cl. ................................ 439/86; 439/71; 439/912
[58] Field of Search ............................ 439/66, 68, 70, 439/71, 86, 91, 525, 526, 912; 324/757, 755, 158 F

[56] References Cited

U.S. PATENT DOCUMENTS

| | | | |
|---|---|---|---|
| 4,735,580 | 4/1988 | Hansen et al. | 439/912 |
| 4,835,469 | 5/1989 | Jones et al. | 324/158 |
| 5,362,247 | 11/1994 | Rodriguez | 439/66 |
| 5,680,057 | 10/1997 | Johnson | 439/91 |

*Primary Examiner*—Neil Abrams
*Assistant Examiner*—Brian J. Biggi
*Attorney, Agent, or Firm*—Skjerven, Morrill, MacPherson, Franklin & Friel; Brian D. Ogonowsky

[57] ABSTRACT

An adapter for interfacing a tester with the leads of a dual-flatpack or quad-flatpack is disclosed herein. The adapter includes lengths of a conductive elastomer for making electrical contact with the rows of leads extending from the flatpack. The lengths of conductive elastomer are each located within a slot formed in a body of the adapter and are exposed within a depression in the adapter, where the width and length of the depression correspond to the width and length of the flatpack. The adapter is frictionally secured to the flatpack when the adapter is pressed onto the flatpack. The resilient conductive elastomer makes reliable contact to the leads of the flatpack.

14 Claims, 4 Drawing Sheets

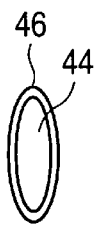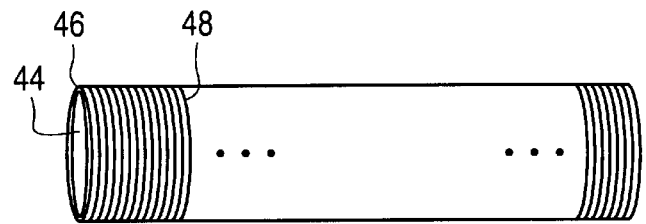
FIG. 4A  FIG. 4B
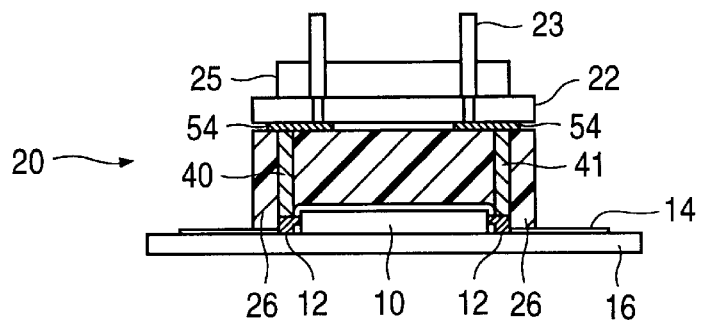
FIG. 5
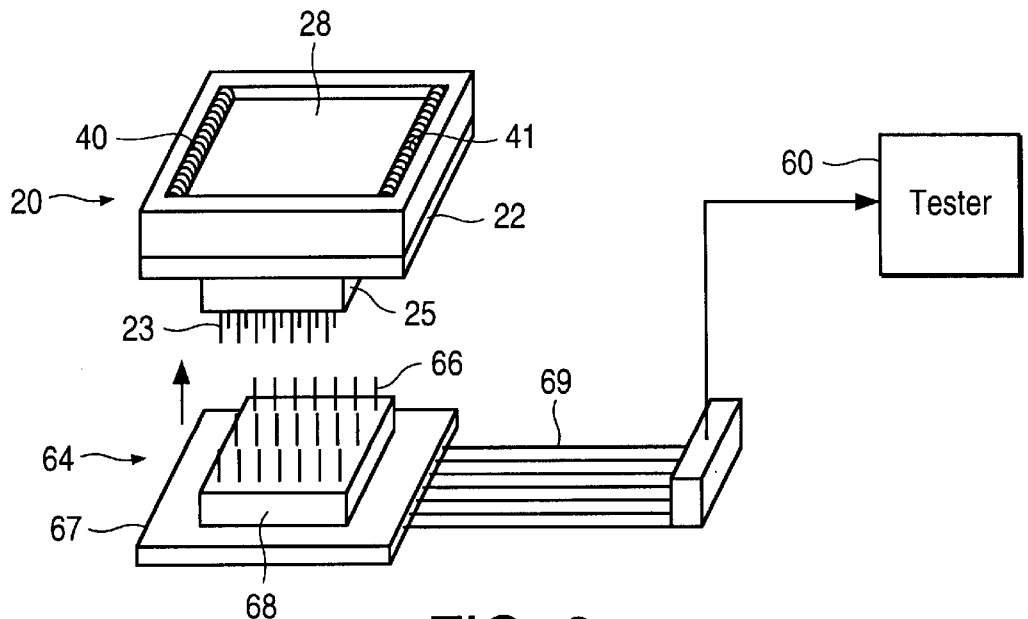
FIG. 6

SURFACE MOUNTED ADAPTER USING ELASTOMERIC CONDUCTORS

FIELD OF THE INVENTION

This invention relates to adapters for integrated circuit packages and, in particular, to an adapter for contacting leads of a surface mounted package.

BACKGROUND OF THE INVENTION

FIG. 1 illustrates a surface mounted packaged integrated circuit known as a flatpack 10. Flatpacks frequently have a thickness on the order of 1 millimeter, although other thicknesses are also common. Flatpack 10 has leads 12 extending from the package which are soldered to conductive traces 14 on a printed circuit board 16. Traces 14 lead to other terminals, which may connect to other printed circuit boards or which may connect to leads of other integrated circuit packages on the same printed circuit board.

Flatpack 10 is a dual-flatpack with leads 12 extending out of two opposite sides of the package. Quad-flatpacks are also known where the leads extend from all four sides of the package.

When developing a circuit board containing one or more flatpacks, it is desirable to gain access to the leads of the flatpack while the flatpack is mounted on the circuit board along with other components to either detect signals at the various leads or to provide signals to the various leads. Thus, it is desirable to provide a test adapter which somehow contacts the various leads of the flatpack so as to electrically connect an external tester to the leads of the flatpack.

One known manner of connecting a tester to leads of a mounted flatpack is to use separate needle probes or other similar types of probes in contact with the flatpack leads. This is a time-consuming process. Another known adapter includes a stud which is glued to the top surface of the flatpack at precisely the center of the flatpack, using a separate frame as a centering guide. An adapter containing terminals which align with the leads of the flatpack is then secured to the package using a nut screwed onto the stud to provide downward pressure on the adapter and to keep the adapter in position. Such adapters are complicated, and it is time-consuming to connect the adapter to the leads of the flatpack. Additionally, the numerous parts increase the cost of the adapter.

What is needed is a simple and inexpensive adapter for a dual-flatpack or a quad-flatpack.

SUMMARY

An adapter for interfacing a tester with the leads of a dual-flatpack or quad-flatpack is disclosed herein. The adapter includes a conductive elastomer for making electrical contact with the rows of leads extending from the flatpack. The conductive elastomer is exposed within a depression in the adapter, where the width and length of the depression correspond to the width and length of the flatpack. Side walls of the depression in the adapter frictionally secure the adapter to the flatpack when the adapter is pressed onto the flatpack. The resilient conductive elastomer makes reliable contact to the leads of the flatpack.

For a dual-flatpack, the adapter is frictionally secured to the two sides of the flatpack which do not contain leads. For a quad-flatpack adapter (or an alternative dual-flatpack adapter), the adapter is frictionally secured to the corners of the flatpack.

Thus, the adapter is a single piece which is mounted onto the flatpack in about one second.

BRIEF DESCRIPTION OF THE DRAWINGS

FIG. 4A is an end view of an elastomeric conductor used in the preferred adapter.

FIG. 4B is a side view of the elastomeric conductor used in the adapter.

FIG. 5 is a side view of the adapter, in cross-section, connected to a flatpack showing the arrangement of elastomeric conductors.

FIG. 6 illustrates how the pins of the adapter can be connected to tester terminals.

DETAILED DESCRIPTION OF THE PREFERRED EMBODIMENTS

Figure 1:
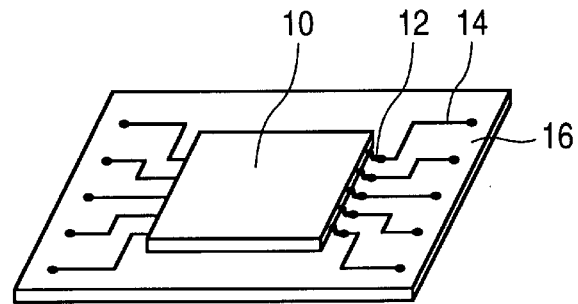
FIG. 1 is a perspective view of a flatpack mounted on a printed circuit board.
Figure 2:
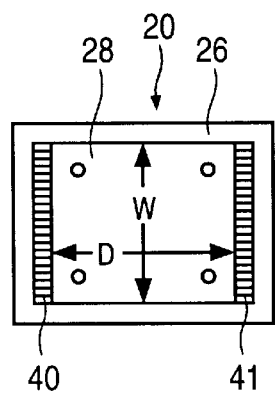
FIG. 2 is a top view of an adapter for a dual-flatpack in accordance with one embodiment of the invention.
Figure 3:
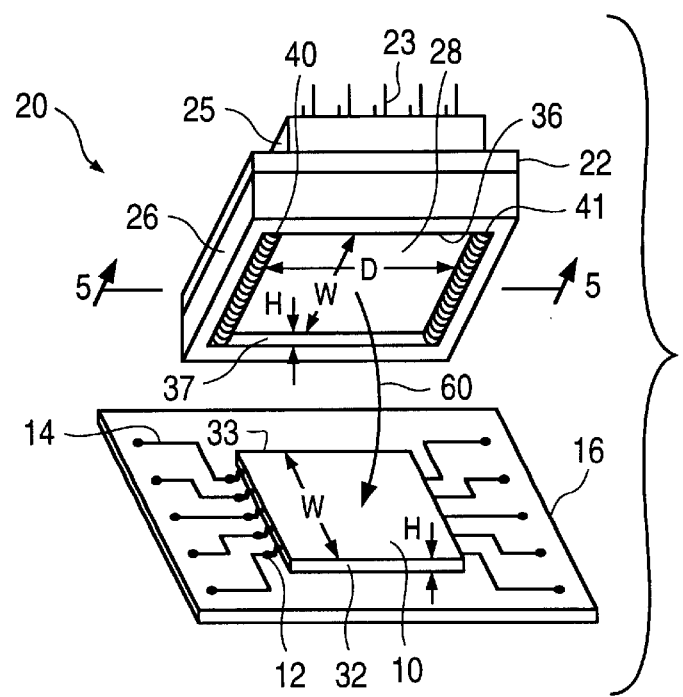
FIG. 3 is a perspective view of the adapter of FIG. 2 and shows how the adapter is frictionally fit onto a flatpack.

FIG. 2 is a top down view of one embodiment of an adapter 20 in accordance with the invention, and FIG. 3 is a perspective view of the adapter 20 shown in FIG. 2. Also shown in FIG. 3 is the flatpack 10 assembly of FIG. 1. Adapter 20 is for a dual-flatpack having leads extending from the plastic or ceramic package on only two sides of the package. In the embodiment of FIGS. 2 and 3, adapter 20 includes a printed circuit board 22. Printed circuit board 22 may contain pins 23 or any other type of connector for interfacing with an external tester in order to test the flatpack. If pins are used, a pin support portion 25 is optionally employed to help prevent bending and shorting together of the pins.

Adapter 20 also consists of a plastic or plexiglass body 26 containing a depression 28, where the depression 28 is approximately the size of the flatpack 10 (FIG. 3) to be tested. Body 26 may be formed of any suitable material and may be rigid or slightly resilient. In one embodiment, body 26 is machined from a block of plexiglass. The width dimension W of depression 28 is preferably the exact same width W of flatpack 10 such that the sides 32 and 33 of flatpack 10 will be frictionally secured to the sides 36 and 37 of depression 28 when adapter 20 is mounted over flatpack 10.

Adapter 20 includes elastomeric conductors 40 and 41 within depression 28.

FIGS. 4A and 4B illustrate in greater detail the structure of such elastomeric conductors 40, 41. The elastomeric conductors 40, 41 consist of a central resilient elastomer core 44 surrounded by a thin polymer strip 46 (e.g., Kapton™) containing a plurality of conductive wires 48 formed thereon. Wires 48 may be formed on strip 48 using a conventional deposition and etching process used to form flex circuits. The pitch of wires 48 may be as little as 5/1000th of an inch. Since each wire 48 is insulated from its neighboring wire 48, the pitch of the wires is not critical, as long as there is at least one wire for each lead of the flatpack under test. One provider of elastomeric conductors which are suitable for implementing the present invention is AMP Incorporated in Harrisburg, Pa.

The distance D between the elastomeric conductors 40, 41 is such that leads 12 of flatpack 10 contact and slightly compress the elastomeric conductors 40, 41 for a reliable electrical connection when adapter 20 is secured over flatpack 10.

The height dimension H of depression 28 is approximately equal to the height dimension H of flatpack 10 so that the top of adapter 20 will be flush with the top of the printed circuit board 16 on which flatpack 10 is mounted.

Preferably, a portion of the elastomeric conductors 40, 41 extends slightly beyond the outer walls of body 26 so as to increase the reliability of electrical contact to the leads of the flatpack.

Another portion of the elastomeric conductors 40, 41 (shown in FIG. 5) is in contact with conductive traces 54 formed on the printed circuit board 22. Thus, when flatpack 10, mounted on board 16, is pressed into depression 28 in adapter 20, as indicated by arrow 60 (FIG. 3), flatpack 10 will be frictionally secured within depression 28, and each of traces 54 will be electrically connected to an associated lead 12 extending from flatpack 10, via the elastomeric conductors 40, 41. Traces 54 are electrically connected to pins 23 for interfacing with a tester, as more fully described with respect to FIG. 7.

FIG. 5 is a side view of adapter 20 connected to flatpack 10, where adapter 20 is shown in partial cross-section along line 5—5 in FIG. 3 to reveal the elastomeric conductors 40, 41. As seen, elastomeric conductor 40 makes contact to one row of leads 12 extending from a side of flatpack 10 and electrically connects these leads 12 to associated ones of traces 54 formed on board 22. Elastomeric conductor 41 performs an identical function.

FIG. 6 illustrates adapter 20 being electrically connected to terminals of a tester 60. Pins 23 may be male or female. The pin support portion 25 is formed of plastic, plexiglass, epoxy, or any rigid insulator, such as FR4. In one embodiment, support portion 25 is approximately 2 mm thick, and there are 80 pins 23.

A suitable connector 64, having pins 66 for connection to pins 23 on adapter 20, is provided for interfacing adapter 20 with terminals of tester 60. Pins 66 are shown as male pins, but may be either female pins or any other form of connector for connection to suitable connectors on the bottom surface of adapter 20. The connector 64 uses a printed circuit board 67 and support portion 68 identical to the printed circuit board 22 and support portion 25 forming part of adapter 20. A flex cable 69 connects pins 66 to tester 60.

Tester 60 either receives signals from or transmits signals to leads 12 on flatpack 10, via elastomeric conductors 40, 41, when flatpack 10 is pressed into the depression 28 in adapter 20. Tester 60 may be a conventional tester or a circuit to be eventually used with flatpack 10 in a system.

Figure 7:
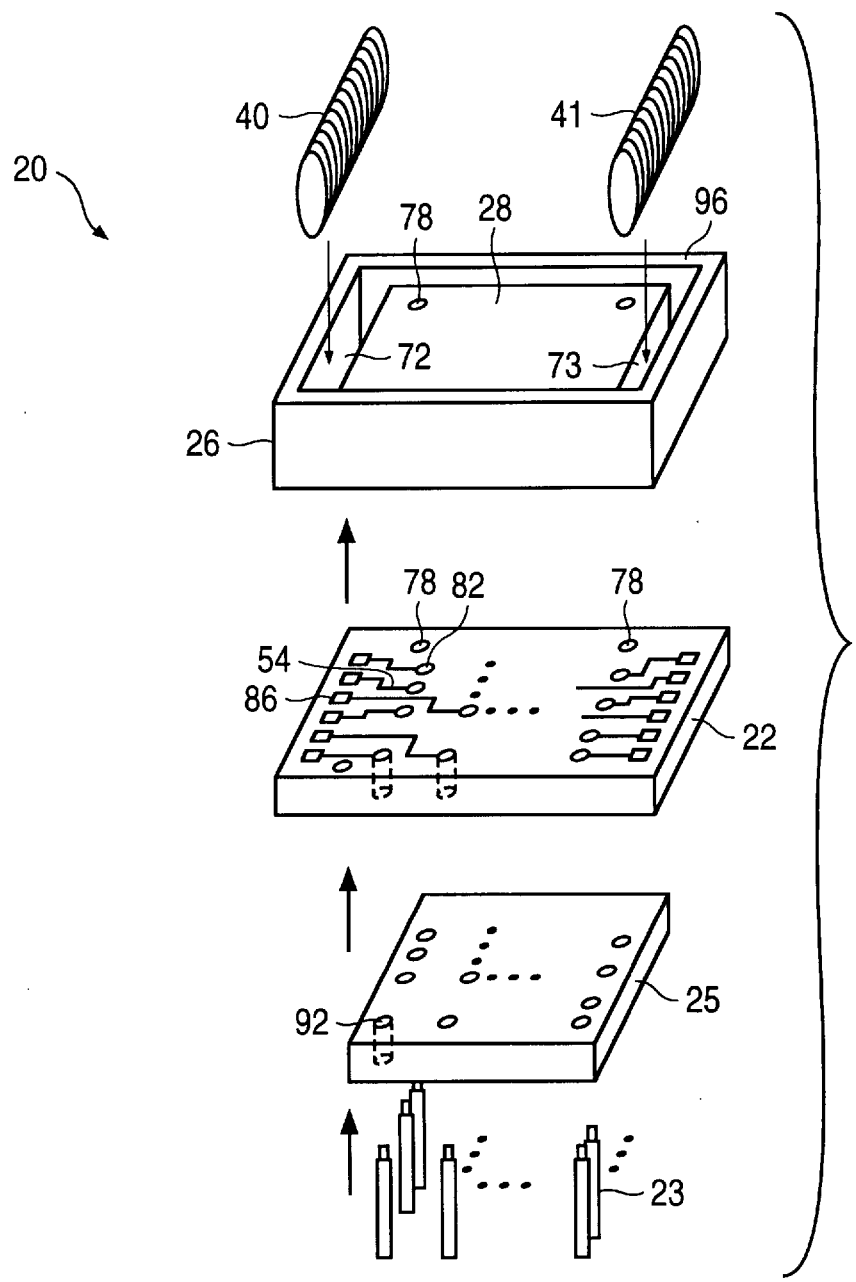
FIG. 7 illustrates the construction of the adapter of FIG. 6.

FIG. 7 illustrates the components used to form adapter 20 of FIG. 6.

A plastic or plexiglass body 26 is formed with depression 28 and slots 72, 73 for containing the elastomeric conductors 40, 41, respectively. Since the elastomeric conductors 40, 41 contain a resilient inner core 44 (FIG. 4A), the elastomeric conductors 40, 41 are simply press fit into slots 72 and 73 and held in place frictionally.

Holes 78 receive screws or other securing mechanism for securing the various pieces of adapter 20 together.

A printed circuit board 22, approximately the size of body 26, contains a number of holes 82 which are plated with a conductive material, such as aluminum, tin/lead solder, or any other metal or alloy. The plating within each hole 82 is connected via a conductive trace 54 to a respective pad 86. When body 26 is in contact with the top of board 62, each of pads 86 electrically contacts a portion of the elastomeric conductors 40, 41. Support portion 25 contains holes 92, which align with holes 82 and are simply used for additional support of pins 23.

Pins 23 are inserted through holes 92 and partially through holes 82 in board 22. Pins 23 are then soldered to the metal linings of holes 82 to thus be electrically connected to one or more wires 48 in the elastomeric conductors 40, 41. The support portion 25 is held in place with respect to board 22 by the friction fit of pins 23 through holes 92.

Instead of pins 23 and support portion 25, board 22 may include a ball grid array pattern or any other type of connector, including an elastomeric conductor.

The structures of FIGS. 2–7 and the alternative structures described in the specification are easily adapted for any form of surface mounted package, such as SSOP, SOJ, TSOP, SOIC, and other well known standard packages.

In one embodiment, the walls 96 (FIG. 7) of adapter 20 between depression 28 and the outer boundary of adapter 20 are made as thin as practical, while still providing sufficient mechanical support, so that adapter 20 may fit over a surface mounted package which is close to an adjacent surface mounted package. In one embodiment, the thickness of each wall 96 is 0.5 millimeters or less. Such a thickness provides additional resilience to walls 96.

In a specific embodiment of adapter 20 to be used for a conventional flatpack 10 with a package width of 12 millimeters (mm) and a mold protrusion having a tolerance of 0.15 mm per side, the width W of depression 28 is 12.014 mm±0.007 mm so as to provide a friction fit against the sides of the flatpack 10. The standard dimensions and tolerancing of flatpack 10 conform to ANSI Y14.5M-1982. Using such conventional tolerances, adapter 20 is snapped onto the top of flatpack 10 using a slight force and easily removed from flatpack 10. The frictional force is sufficient to keep adapter 20 engaged with flatpack 10 under normal stresses provided to any of the connectors coupling adapter 20 to an external tester.

Conventional flatpacks have standard lead pitches of 0.5 mm or 0.55 mm and have a variety of standard dimensions, so a different adapter 20 is provided for each standard size flatpack. The width dimensions of such standard flatpacks include 6 mm, 8 mm, 10 mm, 12 mm, and 14 mm. Thus, each size adapter 20 will have a depression 28 with a width dimension preferably exactly the same as the standard flatpack widths so as to provide a friction fit within the tolerances provided.

The lengths of flatpacks (excluding leads) are also standard and include lengths of 12.4 mm, 14.4 mm, 16.4 mm, and 18.4 mm. Other sizes of flatpacks are also used. The number of leads of flatpacks are also standard and range from 24 to greater than 100 leads per package. For a flatpack having a plastic or ceramic portion of length 18.40 mm, with the total length, including the leads, being 20.00 mm, the distance D between the centers of opposing elastomeric conductors 40, 41 (see FIG. 2), in one embodiment, is approximately 19.78 mm in order for firm contact between the elastomeric conductors 40, 41 and the leads of the flatpack. The distance between elastomeric conductors 40, 41 is not critical due to the resiliency of the elastomeric conductors 40, 41.

Figure 8:
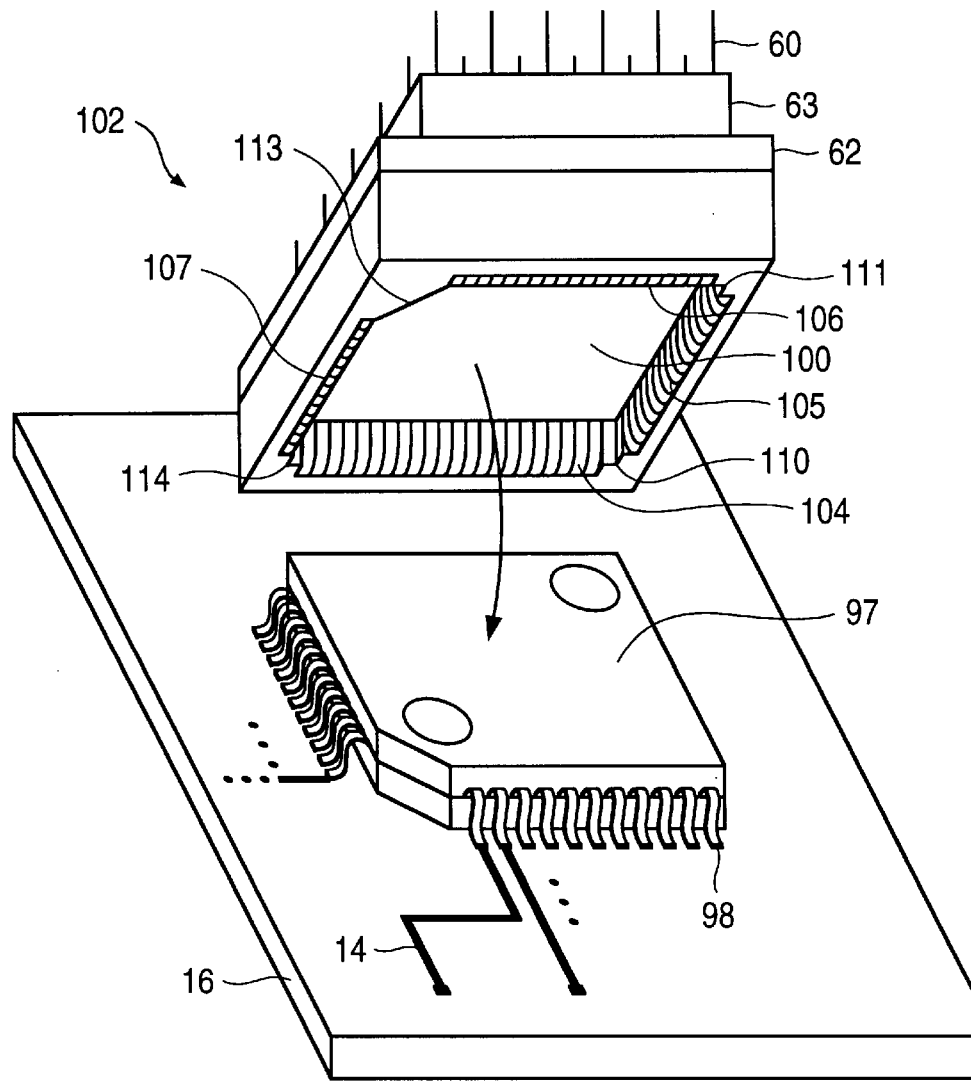
FIG. 8 is a perspective view of an adapter in accordance with the invention which secures to corners of a quad-flatpack or dual-flatpack.

The concept of frictionally securing an adapter to portions of a surface mounted package may also be extended to an adapter for quad-flatpacks, such as shown in FIG. 8. Such quad-flatpacks 97 have leads 98 extending from all four sides of the flatpack but have exposed corners. The depression 100 in the quad-flatpack adapter 102 contains four elastomeric conductors 104, 105, 106, 107 and four plastic corners 110, 111, 112, 113 which are sized to provide a friction fit onto the corresponding corners of the flatpack when the flatpack is pressed into depression 100. Rubber or other resilient inserts may be used for the corners of depression 100 to increase friction.

Figure 9:
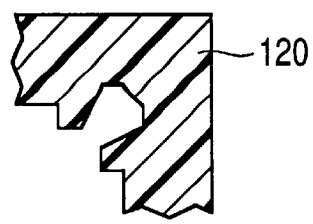
FIG. 9 is a top view of an inside corner of a depression in the adapter showing that the corners may have a variety of shapes to accommodate a variety of flatpack geometries.

There are many standard corner configurations of surface mounted packages and, thus, the corner configurations of depression 100 would correspond to such standard corners. For example, FIG. 9 illustrates a corner configuration 120 of depression 100 which engages a reverse configuration of a corner of a flatpack. Further, many flatpacks include a corner having a different shape than the other corners, and such a configuration would also be provided for the corners of the adapter so as to ensure the adapter is correctly mounted onto the flatpack.

The remainder of the quad-flatpack adapter 102 may be similar to that described with respect to FIG. 7, except that traces 84 (FIG. 7) and contact pads 86 would extend around all four sides of the printed circuit board 62. Any other connector for making electrical contact to the elastomeric conductors 104–107 may be used.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An adapter for a surface mounted package, said package having leads, said adapter comprising:
   a body having a depression, said depression having a dimension such that, when a surface mounted package is inserted into said depression, said surface mounted package is frictionally secured within said depression, said package being frictionally secured within said depression without manually changing said dimension;
   one or more rows of flexible conductors within said depression, said flexible conductors including a resilient insulating portion having a plurality of parallel conductors in contact with said resilient insulating portion, said flexible conductors being located within said depression such that, when said surface mounted package is inserted into said depression, each lead of said package contacts one or more of said parallel conductors; and
   a conductive interface including a first terminal portion contacting a plurality of said parallel conductors and a second terminal portion for connection to an external circuit,
   said package being frictionally secured within said depression causing a reliable electrical contact to result between said each lead of said package and said one or more of said parallel conductors.

2. The adapter of claim 1 wherein said body has slots formed therein, each of said slots containing a row of said flexible conductors.

3. The adapter of claim 1 wherein there are two rows of said flexible conductors.

4. The adapter of claim 1 wherein there are four rows of said flexible conductors.

5. The adapter of claim 1 wherein said surface mounted package has two pairs of opposing sides, wherein said depression has inner walls surrounding said depression, and wherein said inner walls of said depression frictionally secure to a pair of said opposing sides of said package when said package is inserted into said depression.

6. The adapter of claim 1 wherein said depression has corners, wherein said surface mounted package has corners, and wherein said corners of said depression frictionally secure to said corners of said package when said package is inserted into said depression.

7. The adapter of claim 1 wherein said flexible conductors comprise an elastomeric core and an insulating strip with parallel wires formed thereon, said strip being attached to said core.

8. The adapter of claim 1 wherein said depression has a width dimension, wherein said width dimension of said depression is approximately equal to a width dimension of said package to be inserted into said depression.

9. The adapter of claim 1 wherein said first terminal portion of said conductive interface comprises a printed circuit board having conductive traces formed thereon, said traces having a portion in contact with one or more of said parallel conductors.

10. The adapter of claim 9 wherein said second terminal portion of said conductive interface comprises other portions of said conductive traces extending to a connector for electrically connecting said one or more of said parallel conductors to a circuit.

11. The adapter of claim 9 wherein said traces contact pins inserted through holes in said printed circuit board.

12. The adapter of claim 1 wherein said second terminal portion comprises pins.

13. The adapter of claim 12 further comprising a support portion for said pins to help prevent said pins from bending and shorting together.

14. The adapter of claim 1 further comprising a surface mounted package inserted into said depression, with leads of said surface mounted package in contact with said parallel conductors.

* * * * *